(12) United States Patent
Takahashi

(10) Patent No.: US 8,203,360 B2
(45) Date of Patent: Jun. 19, 2012

(54) SEMICONDUCTOR INTEGRATED CIRCUIT

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/024,873

(22) Filed: Feb. 10, 2011

(65) Prior Publication Data

US 2011/0199120 A1    Aug. 18, 2011

(30) Foreign Application Priority Data

Feb. 18, 2010   (JP) ................................. 2010-034040

(51) Int. Cl.
*H03K 19/094*   (2006.01)
(52) U.S. Cl. ............................................ 326/83; 326/27
(58) Field of Classification Search .............. 326/26–28, 326/82–87, 93, 56–58
See application file for complete search history.

(56) References Cited

U.S. PATENT DOCUMENTS

| 5,864,244 | A | * | 1/1999 | Kaplinsky ........................ 326/58 |
| 5,929,667 | A | * | 7/1999 | Abadeer et al. ................ 327/112 |
| 6,175,253 | B1 | * | 1/2001 | Maiyuran et al. ................ 326/86 |
| 6,348,814 | B1 | * | 2/2002 | Peterson ........................ 326/58 |

FOREIGN PATENT DOCUMENTS

JP    2004-213888 A    7/2004

* cited by examiner

*Primary Examiner* — Don Le
(74) *Attorney, Agent, or Firm* — Foley & Lardner LLP

(57) ABSTRACT

A semiconductor integrated circuit capable of reducing unnecessary current consumption includes a plurality of bus drive circuits for receiving data input, a common bus coupled to the bus drive circuits, and a bus holder coupled to the common bus. One of the bus drive circuits is selected as the selected bus drive circuit. When a logical value corresponding to the data input to be output is the same as a logical value that has been held by the bus holder and output to the common bus, the selected bus drive circuit stops outputting the logical value corresponding to the data input to the common bus. With this configuration, it is possible to eliminate the unnecessary output of the selected bus drive circuit, and to reduce unnecessary current consumption compared to the conventional semiconductor integrated circuit.

15 Claims, 7 Drawing Sheets

SEMICONDUCTOR INTEGRATED CIRCUIT

CROSS-REFERENCE TO RELATED APPLICATIONS

The disclosure of Japanese Patent Application No. 2010-34040 filed on Feb. 18, 2010 including the specification, drawings and abstract is incorporated herein by reference in its entirety.

BACKGROUND

1. Field of the Invention

The present invention relates to a semiconductor integrated circuit including a bus drive circuit for driving a bus.

2. Description of Related Art

With the recent increase in the area of a specific part, there has been developed a technology of manufacturing a semiconductor integrated circuit in which the area of the specific part is divided into a plurality of areas or layers. There is an example of a memory macro mounted on a semiconductor integrated circuit. In this case, the memory macro is divided into a plurality of array portions or layers due to an increase in the area of the memory macro. The semiconductor integrated circuit reads data from one of the array portions. With this configuration, it is possible to reduce the current consumption for bus driving, compared to the case in which the data is read from the memory macro.

FIG. 1 is a block diagram of a conventional semiconductor integrated circuit. The semiconductor integrated circuit includes a plurality of array portions 1-1 to 1-n (where n is an integer of 2 or more), first and second data lines LB and LBB, a plurality of bus drive circuits 102-1 to 102-n, a common bus 3, an I/O circuit 4, and a bus holder 5.

The first and second data lines LB, LBB are coupled to each of the array portions 1-1 to 1-n. The bus drive circuits 102-1 to 102-n corresponding to the array portions 1-1 to 1-n are coupled to the first and second data lines LB, LBB of the array portions 1-1 to 1-n, respectively. The common bus 3 is coupled to the bus drive circuits 102-1 to 102-n. The I/O circuit 4 is coupled to the common bus 3. The input and output of the bus holder 5 are coupled to the common bus 3.

For example, the array portions 1-1 to 1-n are memory circuits that are formed by dividing a memory macro into n array portions. Each of the array portions 1-1 to 1-n includes a memory cell array (not shown) in which memory cells for holding data are arranged in a matrix form, word lines (not shown) arranged in the rows of the memory cell array, and first and second bit lines (not shown) arranged in the columns of the memory cell array. The first and second bit lines are coupled to the first and second data lines LB and LBB, respectively.

The first and second data lines LB, LBB are supplied with data from a selected array portion 1-j (where j is an integer satisfying $1 \leq j \leq n$), which is one of the array portions 1-1 to 1-n. More specifically, the selected word line corresponding to a specified line address is selected from the word lines of the selected array portion 1-j. Further, a pair of selected first and second bit lines corresponding to a specified column address is selected from the first and second bit lines of the selected array portion 1-j. At this time, the data is read from the memory cell that is coupled to the selected word line and to the selected first and second bit lines, which is one of the memory cells of the selected array portion 1-j. A potential difference is generated between the selected first and second bit lines. As a result, the data is supplied to the first and second data lines LB, LBB.

The common bus 3 is supplied with a bus output signal GBUS representing the data, from a selected bus drive circuit 102-j of the bus drive circuit 102-1 to 102-n. The selected bus drive circuit 102-j is coupled to the first and second data lines LB, LBB of the selected array portion 1-j. The I/O circuit 4 receives the bus output signal GBUS as output data.

The bus holder 5 holds the bus output signal GBUS, and supplies the bus output signal GBUS to the common bus 3. An example of the bus holder 5 is a flip flop circuit.

FIG. 2 is a simplified block diagram of the technology described in Japanese Unexamined Patent Publication No. 2004-213888, showing the configuration of the individual bus drive circuits 102-1 to 102-n shown in FIG. 1.

Each of the bus drive circuits 102-1 to 102-n includes a buffer 7, an amplifier 7, and a logic circuit 108.

The buffer 7 includes a first transistor MPT and a second transistor MNT.

The first transistor MPT is a p-channel metal oxide semiconductor field effect transistor (p-type MOSFET) used as a pull-up transistor. The first transistor MPT is coupled between a power source and the common bus 3.

The second transistor MNT is an n-channel metal oxide semiconductor field effect transistor (n-type MOSFET) used as a pull-down transistor. The second transistor MNT is coupled between the common bus 3 and ground.

The amplifier 6 is supplied in each cycle with a precharge signal PC having a high signal level "H". The amplifier 6 provides a first potential to the first and second data lines LB and LBB, in response to the precharge signal PC "H" in each cycle. At the same time, the amplifier 6 sets the signal level of the first and second signals D, DB corresponding to the first and second data lines LB, LBB to high level "H".

Further, the amplifier 6 of the selected bus drive circuit 2-j is supplied with a sense enable signal SE having a high signal level "H". In response to the sense enable signal SE "H", the amplifier 6 of the selected bus drive circuit 2-j changes the signal level of the first signal D or the second signal DB from high level "H" to low level "L" when the potential of the first data line LB or the second data line LBB is reduced to a second potential lower than the first potential.

The logic circuit 108 outputs a first control signal P_B "L" when the signal level of the first signal D is high level "H" and the signal level of the second signal DB is low level "L". In response to the first control signal P_B "L", the first transistor MPT is turned on and the signal level of the bus output signal GBUS is set to high level "H".

On the other hand, when the signal level of the first signal D is low level "L" and the signal level of the second signal DB is high level "H", the logic circuit 108 outputs a second control signal N "H". In response to the second control signal N "H", the second transistor MNT is turned on and the signal level of the bus output signal GBUS is set to low level "L".

The logic circuit 108 includes a first AND circuit 111, a second AND circuit 112, a first output circuit 113, and a second output circuit 114.

The first AND circuit 111 is supplied with the first signal D. Further, the first AND circuit 111 of the selected bus drive circuit 102-j is supplied with an enable signal DEj having a high signal level "H", during the period from the time when the signal level of the first signal D or the second signal DB is changed from high level "H" to low level "L", to the time when the precharge signal PC "H" is supplied to the amplifier 6.

The second AND circuit 112 is supplied with a second signal DB. Further, the second AND circuit 112 of the selected bus drive circuit 102-j is supplied with the enable signal DEj having a high signal level "H".

The first output circuit 113 is an inverter circuit for inverting the output signal P of the first AND circuit 111. The input of the first output circuit 113 is coupled to the output of the first AND circuit 111. The output of the first output circuit 113 is coupled to a gate of the first transistor MPT. When the signal level of the output signal P of the first AND circuit 111 is high level "H", the signal level of an output signal P_B (where the suffix of "_B" means logical negation and is read "bar B") of the first output circuit 113 is low level "L". At this time, the first output circuit 113 outputs the output signal P_B "L" as a first control signal P_B "L". In response to the first control signal P_B "L", the first transistor MPT is turned on and the signal level of the bus output signal GBUS is set to high level "H".

The second output circuit 114 is a buffer circuit. The input of the second output circuit 114 is coupled to the output of the second AND circuit 112. The output of the second output circuit 114 is coupled to a gate of the second transistor MNT. When the signal level N of the second AND circuit 112 is high level "H", the signal level of an output signal N of the second output circuit 114 is high level "H". At this time, the second output circuit 114 outputs the output signal N "H" as a second control signal N "H". In response to the second control signal N "H", the second transistor MNT is turned on and the signal level of the bus output signal GBUS is set to low level "L".

With the above configuration, the bus output signal GBUS is supplied to the common bus 3 from the selected bus drive circuit 102-j. In this case, the output of the buffer 7 is in a high impedance state in each of the unselected bus drive circuits other than the selected bus drive circuit 102-j of the bus drive circuits 102-1 to 102-n.

SUMMARY

In the recent years, there has been an increase in the number of data bits and in the transfer frequency in semiconductor integrated circuits. However, this increase is accompanied by an increase in the power consumption for bus driving. When a memory macro is mounted on a semiconductor integrated circuit, the size of the memory further increases. Thus, the area of the entire memory cell array increases, resulting in an increase in the number of array portions and in the number of bus drive circuits. In other words, the number n increases. In this case, the line length of the common bus 3 increases. Thus, the increase in the current consumption is a more serious problem.

The power consumption for bus driving is determined by the data change probability, which is the possibility of the change in the output data (bus output signal GBUS) supplied to the common bus 3. For example, there are four cases of the change in the signal level of the bus output signal GBUS as follows, in other words, the data change probability would be 25%.

(I) The signal level of the bus output signal GBUS is low level "L" in a certain cycle, and changes to high level "L" in the next cycle;

(II) The signal level of the bus output signal GBUS is high level "H" in a certain cycle, and is sill high level "H" in the next cycle;

(III) The signal level of the bus output signal GBUS is high level "H" in a certain cycle, and changes to low level "L" in the next cycle; and (IV) The signal level of the bus output signal GBUS is low level "L" in a certain cycle, and is still low level "L" in the next cycle.

However, the bus drive circuits 102-1 to 102-n coupled to the common bus 3 are selected at random, so that there is a possibility that (II) and (IV) may occur. In both of the two cases, the signal level of the bus output signal GBUS output from the buffer 7 of the selected bus drive circuit 102-j, is the same as the signal level of the bus output signal GBUS in the previous cycle. However, the first transistor MPT or the second transistor MNT is still turned on. The current is unnecessarily consumed during this period.

The heavier the load on the common bus 3, the larger the size of the bus drive transistors (the first and second transistors MPT, MNT). In general, it is well know that setting the fan out (Cout/Cin) to about three is appropriate for the design that prioritizes high speed operation in the logic circuit 108. According to this principle, if the total load (Cout) on the common bus 3 is 1, the input capacitance (Cin) of the bus drive transistors (the first and second transistors MPT, MNT) would be reduced to one third. Thus, the average of the transistor sizes of the individual transistors would be one sixth. The probability that the current is consumed by the common bus 3 is 25%, compared to the probability that the current is consumed by the drive transistors is 100%. Thus, taking into account the current consumption rate, the drive transistors consume about two thirds of the current consumed by the common bus 3. If the operation in (II) and (IV) of the above cases (I) to (IV) occurs with a probability of 50%, the amount of the unnecessary current consumption in (II), (IV) is equivalent to about as much as 20% of the total amount of current consumed by the common bus 3 and the buffer 7. It is desirable to reduce such an unnecessary current consumption.

There is another way of using the common bus 3. In this case, the bus drive circuit and the I/O circuit are selected as point-to-point connections to perform data transfer between the two points. In such a case, the unnecessary operation current, which has been described above, does not occur between the change in the output data supplied to the bus line, and the operation of the bus drive circuit. In this case, the current consumption is reduced by a method of the prior art (omitted) that reduces the current consumption by converting the common bus to low amplitude signals. This approach for reducing the amplitude of the bus line requires a control circuit and power supply circuit for controlling the bus line. The circuit configuration is complicated (with the necessity of using a circuit for analog controlling the intermediate potential between VDD and GND). This leads to an increase in the circuit area and in the design difficulty, resulting in an increase in the design cost. In particular, assuming that a bus drive circuit is selected at random, there exists spatial location dependence (corresponding to the state in which the magnitude of the bus line resistance is visible at random for each data), in addition to the complexity of the circuit configuration. In this case, there would be a negative effect on high speed operation and low power consumption. Because of the increase in the number of bus lines, namely, the increase in the number of data bits and in the number of bus drive circuits, the low-amplitude approach tends to be used only for the two-point transfer under limited conditions.

In the following explanation of the means for solving the problem, the numerals and symbols that are used in the description of the preferred embodiments are enclosed in parentheses. These numerals and symbols are added to clarify the correspondence between the description of the appended claims and the description of the preferred embodiments. Thus, these numerals and symbols must not be used in interpreting the technical scope of the present invention that is described in the appended claims.

The semiconductor integrated circuit according to the present invention includes a plurality of bus drive circuits (2-1 to 2-n (where n is an integer of 2 or more)), a common bus (3) coupled to the bus drive circuits (2-1 to 2-n), and a bus holder (5) coupled to the common bus (3). When the logical value corresponding to the data input to be output is the same as the logical value that is held by the bus holder (5) and output to the common bus (3), a selected bus drive circuit (2-j (where j is an integer satisfying $1 \leq j \leq n$)) of the bus drive circuits (2-1 to 2-n) stops outputting the logical value corresponding to the data input to the common bus (3).

The change in the signal level of the bus output signal (GBUS) can be classified into four cases (I) to (IV) as described above. In the semiconductor integrated circuit according to the present invention, with respect to the transition from (I) to (II), when the logical value (corresponding to the data input) that is output from the selected bus drive circuit (2-j) is the same as the logical value that is held by the bus holder (5) and is output to the common bus (3) in the previous cycle, the selected bus drive circuit (2-j) stops outputting the logical value corresponding to the data input. Further, with respect to the transition from (III) to (IV), when the logical value (corresponding to the data input) that is output from the selected bus drive circuit (2-j) is the same as the logical value that is held by the bus holder (5) and output to the common bus (3) in the previous cycle, the selected bus drive circuit (2-j) stops outputting the logical value corresponding to the data input. Thus, if the operation in (II), (IV) of the above cases (I) to (IV) occurs with a probability of 50%, the unnecessary output can be eliminated with the same probability. In other words, it is possible to eliminate the unnecessary current consumption in the case of (II) and (IV). In addition, it is possible to reduce the peak current associated with the output of the selected bus drive circuit (2-j), and to reduce the amount of noise associated with the peak current.

DETAILED DESCRIPTION OF THE PREFERRED EMBODIMENTS

Hereinafter, a semiconductor integrated circuit according to each embodiment of the present invention will be described in detail with reference to the accompanying drawings.

First Embodiment

Figure 1:
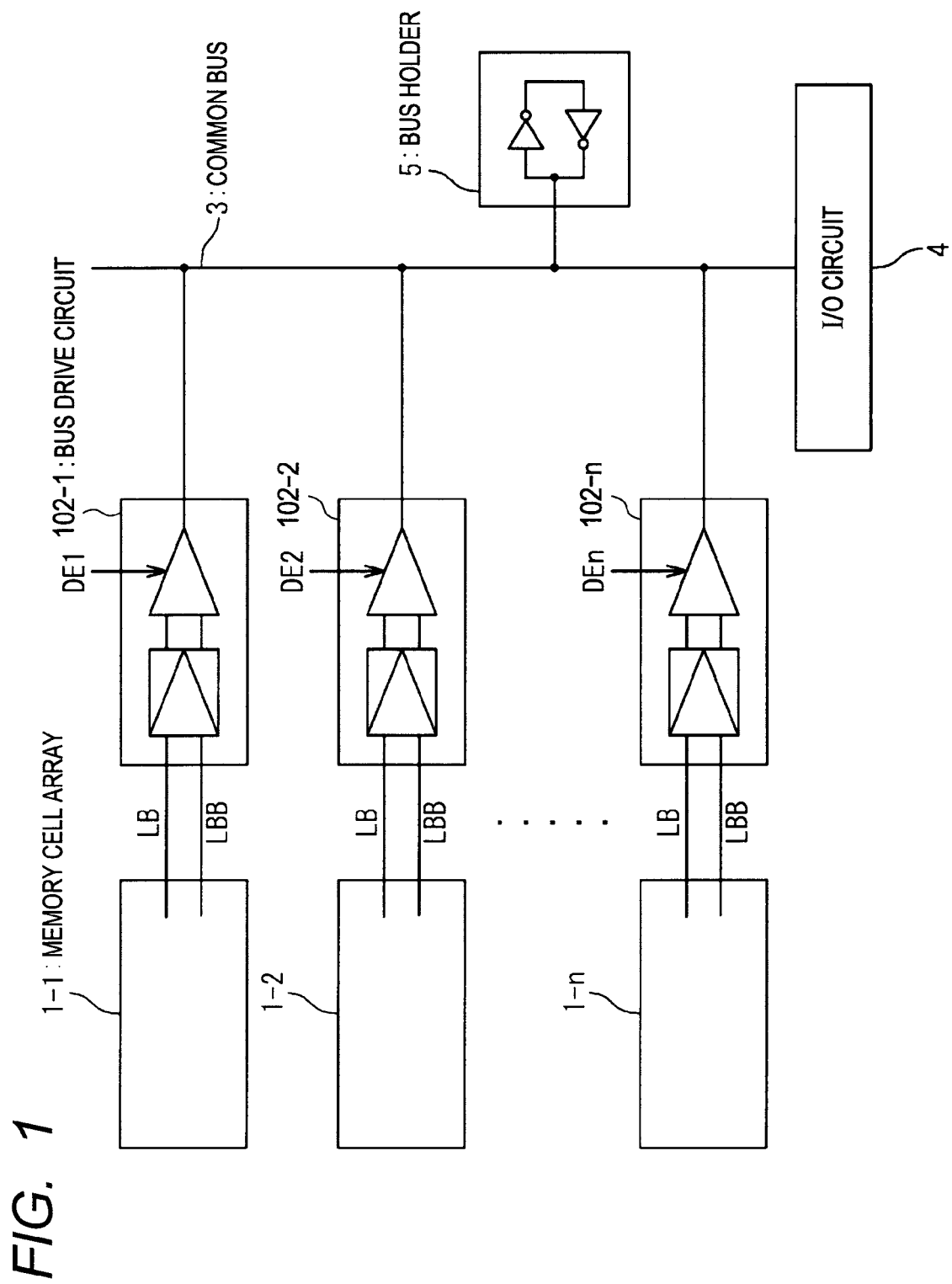
FIG. 1 is a block diagram of a conventional semiconductor integrated circuit.
Figure 2:
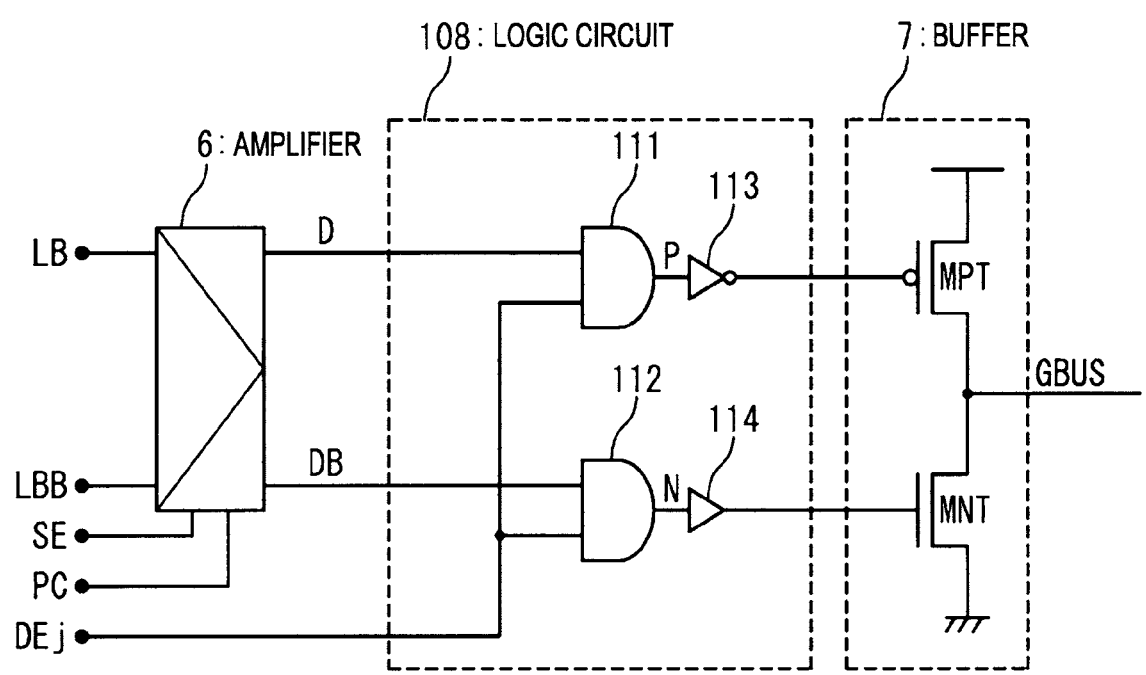
FIG. 2 is a simplified block diagram of the technology described in Japanese Unexamined Patent Publication No 2004-213888, showing the configuration of the bus drive circuits 102-1 to 102-n shown in FIG. 1.
Figure 3:
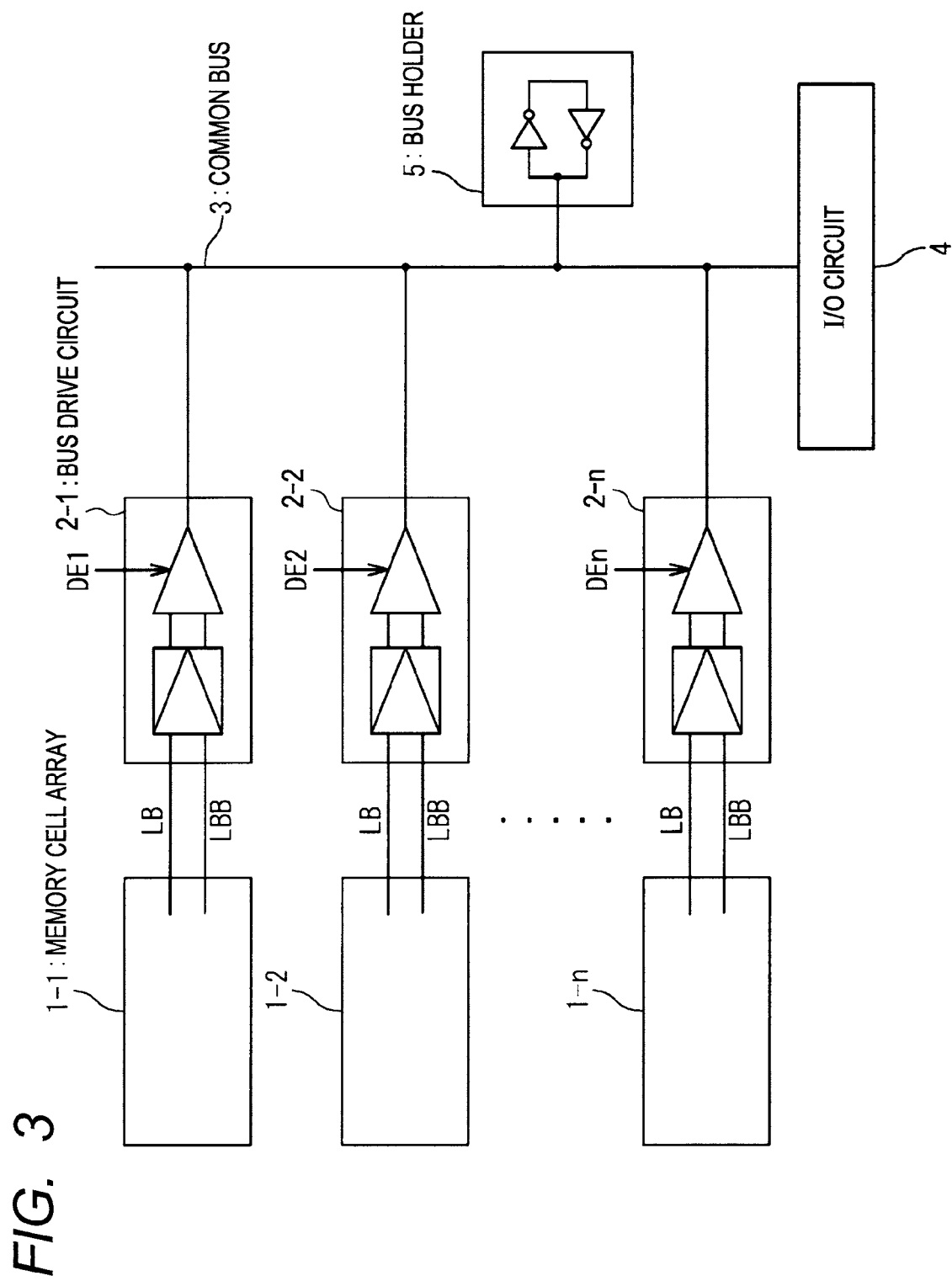
FIG. 3 is a block diagram of a semiconductor integrated circuit according to a first embodiment of the present invention.

FIG. 3 is a block diagram of a semiconductor integrated circuit according to a first embodiment of the present invention. The semiconductor integrated circuit includes a plurality of array portions 1-1 to 1-2 (where n is an integer of 2 or more), first and second data lines LB and LBB, a plurality of bus drive circuits 2-1 to 2-n, a common bus 3, an I/O circuit 4, and a bus holder 5.

The first and second data lines LB, LBB are coupled to each of the array portions 1-1 to 1-n. The bus drive circuits 2-1 to 2-n are provided corresponding to the array portions 1-1 to 1-n. Each of the bus drive circuits 2-1 to 2-n is coupled to the first and second data lines LB, LBB of each of the array portions 1-1 to 1-n. The common bus 3 is coupled to the bus drive circuits 2-1 to 2-n. The I/O circuit 4 is coupled to the common bus 3. The input and output of the bus holder 5 are coupled to the common bus 3. An example of the bus holder 5 is a flip-flop circuit.

For example, the array portions 1-1 to 1-n are memory circuits that are formed by dividing a memory macro into n array portions. Each of the array portions 1-1 to 1-n includes a memory cell array (not shown) in which memory cells for holding data are arranged in a matrix form, word lines (not shown) arranged in the rows of the memory cell array, and first and second bit lines (not shown) arranged in the columns of the memory cell array. The first and second bit lines are coupled to the first and second data lines LB and LBB, respectively.

The first and second data lines LB, LBB are supplied with data from a selected array portion 1-j (where j is an integer satisfying $1 \leq j \leq n$), which is one of the array portions 1-1 to 1-n. More specifically, the selected word line corresponding to a specified line address is selected from the word lines of the selected array portion 1-j. Further, a pair of selected first and second bit lines corresponding to a specified row address is selected from the first and second bit lines of the selected array portion 1-j. At this time, data is read from the memory cell that is coupled to the selected word line and to the selected first and second bit lines, which is one of the memory cells of the selected array portion 1-j. A potential difference is generated between the selected first and second bit lines. As a result, the data is supplied to the first and second data lines LB, LBB.

The common bus 3 is supplied with a bus output signal GBUS representing the data from a selected bus drive circuit 102-j of the bus drive circuit 2-1 to 2-n. The selected bus drive circuit 2-j is coupled to the first and second data lines LB, LBB of the selected array portion 1-j. The I/O circuit 4 receives the bus output signal GBUS as the output data.

The bus holder 5 holds the bus output signal GBUS, and supplies the bus output signal GBUS to the common bus 3. An example of the bus holder 5 is a flip flop circuit.

Figure 4:
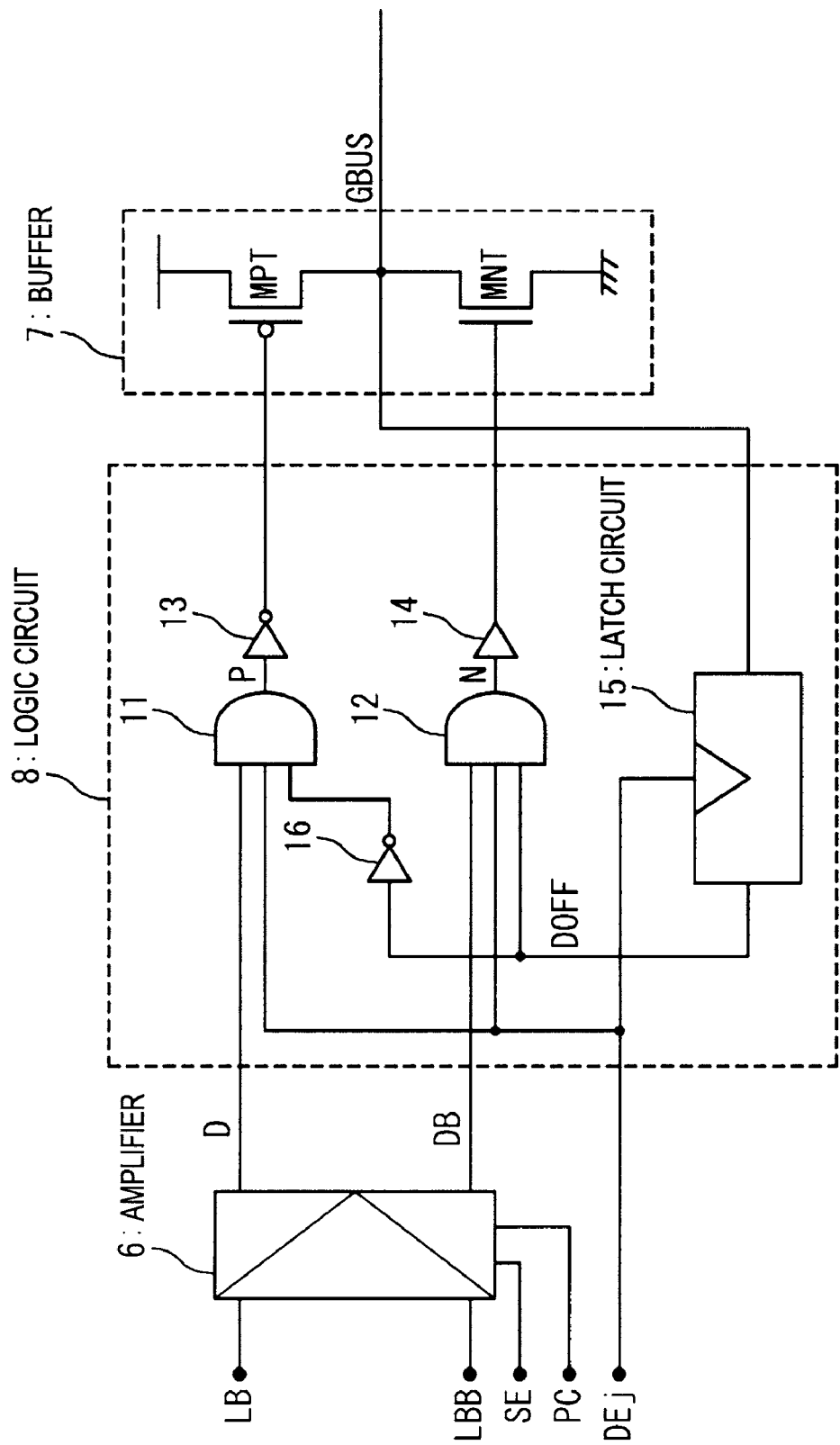
FIG. 4 is a block diagram of the bus drive circuits 2-1 to 2-n in the semiconductor integrated circuit according to the first embodiment of the present invention.

FIG. 4 is a block diagram of the bus drive circuits 2-1 to 2-n in the semiconductor integrated circuit according to the first embodiment of the present invention.

Each of the bus drive circuit 2-1 to 2-n includes a buffer 7, an amplifier 6, and a logic circuit 8.

The buffer 7 includes a first transistor MPT and a second transistor MNT.

The first transistor MPT is a p-channel metal oxide semiconductor field effect transistor (P-type MOSFET) used as a pull-up transistor. The first transistor MPT is coupled between a power source and the common bus 3.

The second transistor MNT is an n-channel metal oxide semiconductor field effect transistor (n-type MOSFET) used as a pull-down transistor. The second transistor MNT is coupled between the common bus 3 and ground.

The amplifier 6 is supplied in each cycle with a precharge signal PC having a high signal level "H". The amplifier 6 provides a first potential to the first and second data lines LB and LBB, in response to the precharge signal PC "H" in each cycle. At the same time, the amplifier 6 sets the signal level of the first and second signals D, DB corresponding to the first and second data lines LB, LBB, to high level "H"

Further, the amplifier 6 of the selected bus drive circuit 2-*j* is supplied with a sense enable signal SE having a high signal level "H". In response to the sense enable signal SE "H", the amplifier 6 of the selected bus drive circuit 2-*j* changes the signal level of the first signal D or the second signal DB from high level "H" to low level "L" when the potential of the first data line LB or the second data line LBB is reduced to a second potential lower than the first potential.

The logic circuit 8 outputs a first control signal P_B "L" when the signal level of the first signal D is high level "H" and the signal level of the second signal DB is low level "L". In response to the first control signal P_B "L", the first transistor MPT is turned on and the signal level of the bus output signal GBUS is set to high level "H".

On the other hand, when the signal level of the first signal D is low level "L" and the signal level of the second signal DB is high level "H", the logic circuit 8 outputs a second control signal N "H". In response to the second control signal N "H", the second transistor MNT is turned on and the signal level of the bus output signal GBUS is set to low level "L".

The logic circuit 8 includes a first AND circuit 11, a second AND circuit 12, a first output circuit 13, a second output circuit 14, a latch circuit 15, and an inverter circuit 16.

The first AND circuit is supplied with the first signal D as well as the output of the inverter circuit 16. Further, the first AND circuit 11 of the selected bus drive circuit 2-*j* is supplied with an enable signal DEj having a high signal level "H", during the period from the time when the signal level of the first signal D or the second signal DB is changed from high level "H" to low level "L" to the time when the precharge signal PC "H" is supplied to the amplifier 6.

The second AND circuit 12 is supplied with the second signal DB and a delay output signal DOFF. Further, the second AND circuit 12 of the selected bus drive circuit 2-*j* is supplied with the enable signal DEj having a high signal level "H".

The first output circuit 13 is an inverter circuit for inverting an output signal P of the first AND circuit 11. The input of the first output circuit 13 is coupled to the output of the first AND circuit 11. The output of the first output circuit 13 is coupled to a gate of the first transistor MPT. When the signal level of the output signal P of the first AND circuit 11 is high level "H", the signal level of the output signal P_B (where the suffix of "_B" means logical negation and is read "bar B") of the first output circuit 13 is low level "L". At this time, the first output circuit 13 outputs the output signal P_B "L" as a first control signal P_B "L". In response to the first control signal P_B "L", the first transistor MPT is turned on and the signal level of the bus output signal GBUS is set to high level "H".

The second output circuit 14 is a buffer circuit. The input of the second output circuit 14 is coupled to the output of the second AND circuit 12. The output of the second output circuit 14 is coupled to a gate of the second transistor MNT. When the signal level of the output signal N of the second AND circuit 12 is high level "H", the second output circuit 14 outputs the output signal N "H" as a second control signal N "H". In response to the second control signal N "H", the second transistor MNT is turned on and the signal level of the bus output signal GBUS is set to low level "L".

The input of the latch circuit 15 is coupled to the common bus 3. The latch circuit 15 of the selected bus drive circuit 2-*j* is supplied with a latch enable signal. The latch enable signal is generated by changing the signal level of the enable signal DEj from high level "H" to low level "L". The latch circuit 15 latches the bus output signal GBUS that is held by the bus holder 5 and output to the common bus 3 in the previous cycle when the signal level of the enable signal DEj is changed from high level "H" to low level "L", or in response to the latch enable signal. Then, the latch circuit 15 outputs the latched bus output signal GBUS as the delay output signal DOFF.

The inverter circuit 16 is coupled to the latch circuit 15 and the first AND circuit 11. The inverter circuit 16 outputs the inverted signal of the delay output signal DOFF to the first AND circuit 11.

With the above configuration, in the semiconductor integrated circuit according to the first embodiment of the present invention, the bus output signal GBUS is supplied to the common bus 3 from the selected bus drive circuit 2-*j*. In this case, the output of the buffer 7 is in a high impedance state in each of the unselected bus drive circuits other than the selected bus drive circuit 2-*j* of the bus drive circuits 2-1 to 2-*n*.

Further, in the semiconductor integrated circuit according to the first embodiment of the present invention, the selected bus drive circuit 2-*j* outputs the bus output signal GBUS from the buffer 7 based on the signal levels of the first and second signals D, DB. At this time, when the signal level of the bus output signal GBUS to be output from the buffer 7 is the same as the signal level of the bus output signal GBUS that is held by the bus holder 5 and output to the common bus 3 in the previous cycle, the logic circuit 8 stops outputting the first control signal P_B "L" or the second control signal N "H" to turn off the first transistor MPT or the second transistor MNT. This operation will be described in detail below.

Figure 5:
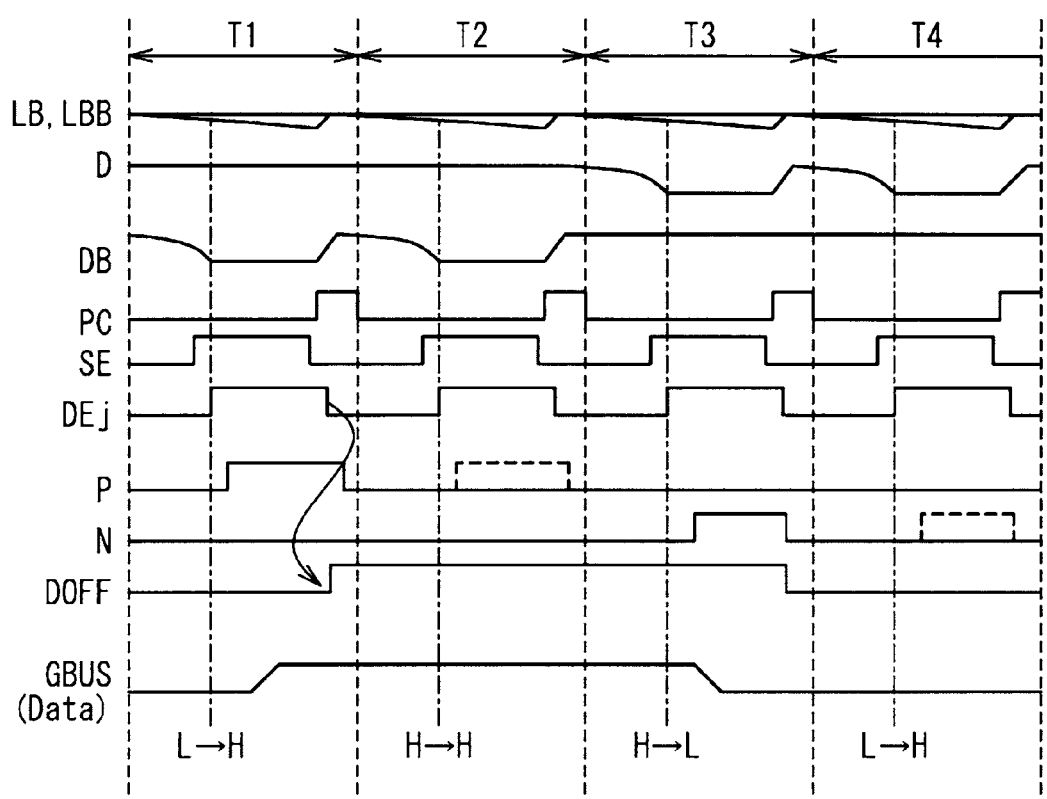
FIG. 5 is a timing chart showing the operation of the semiconductor integrated circuit according to the first embodiment of the present invention.

FIG. 5 is a timing chart showing the operation of the semiconductor integrated circuit according to the first embodiment of the present invention.

In the present invention, there are four cases of the change in the signal level of the bus output signal GBUS as follows:

(I) The signal level of the bus output signal GBUS is low level "L" in a certain cycle and becomes high level "H" in the next cycle;

(II) The signal level of the bus output signal GBUS is high level "H" in a certain cycle and is still high level "H" in the next cycle;

(III) The signal level of the bus output signal GBUS is high level "H" in a certain cycle and becomes low level "L" in the next cycle; and (IV) The signal level of the bus output signal GBUS is low level "L" in a certain cycle and is still low level "L" in the next cycle.

Further, in the present invention, when the signal level of the bus output signal GBUS to be output from the buffer 7 is the same as the signal level of the bus output signal GBUS that is held by the bus holder 5 and output to the common bus 3 in the previous cycle, there are two operations that the logic circuit 8 performs:

(A) With respect to the transition from (I) to (II), the logic circuit 8 stops outputting the first control signal P_B "L" to turn off the first transistor MPT; and (B) With respect to the transition from (III) to (IV), the logic circuit 8 stops outputting the second control signal N "H" to turn off the second transistor MNT.

First, case (A) will be described.

It is assumed that in the cycle prior to the first cycle T1, the bus output signal GBUS that is held by the bus holder 5 and output to the common bus 3 has a low signal level "L". In this case, the latch circuit 15 outputs the delay output signal DOFF having a low signal level "L".

Now, in the cycle T1, data is supplied to the first and second data lines LB, LBB from the selected array portion 1-*j*. At this time, it is assumed that the potential of the second data line LBB is reduced to a level lower than the first potential.

The amplifier 6 of the selected bus drive circuit 2-*j* is supplied with the sense enable signal SE having a high signal level "H". When the potential of the second data line LBB is reduced to a second potential lower than the first potential, in response to the sense enable signal SE "H", the amplifier 6 of the selected bus drive circuit 2-*j* changes the signal level of the second signal DB from high level "H" to low level "L". In this case, the first AND circuit 11 of the selected bus drive circuit 2-*j* is supplied with the first signal D having a high signal level "H". The second AND circuit of the selected bus drive circuit 2-*j* is supplied with the second signal DB having a low signal level "L".

At this time, the enable signal DEj having a high signal level "H" is supplied to the first AND circuit 11, second AND circuit 12, and latch circuit 15 of the selected bus drive circuit 2-*j*. In this case, the first AND circuit 11 outputs the output signal P having a high signal level "H", in response to the first signal D "H", the output of the inverter circuit 16 (the inverted signal "H" of the delay output signal DOFF), and the enable signal DEj "H". The second AND circuit 12 outputs the output signal N having a low signal level "L", in response to the second signal DB "L", the delay output signal DOFF "L", and the enable signal DEj "H". The first output circuit 13 inverts the output signal P "H" of the first AND circuit 11. Then, the first output circuit 13 outputs the inverted output signal P_B "L" to the first transistor MPT as the first control signal P_B "L". The second output circuit 14 outputs the output signal N "L" of the second AND circuit 12 to the second transistor MNT. As a result, the first transistor MPT is turned on in response to the first control signal P_B "L". Then, the signal level of the bus output signal GBUS is changed from low level "L" to high level "H".

Next, the signal level of the sense enable signal SE is changed from high level "H" to low level "L". Then, the signal level of the enable signal DEj is changed from high level "H" to low level "L". As a result, the precharge signal PC "H" is supplied to the amplifier 6. In response to the precharge signal P "H", the amplifier 6 provides a first potential to the first and second data lines LB and LBB. At the same time, the amplifier 6 sets the signal level of the first and second signal D, DB to high level "H".

At this time, in response to the enable signal DEj "L", the latch circuit 15 of the selected bus drive circuit 2-*j* latches the bus output signal GBUS that is held by the bus holder 5 and output to the common bus 3 in the previous cycle. Then, the latch circuit 15 outputs the latched bus output signal GBUS as the delay output signal DOFF. In other words, the latch circuit 15 outputs the delay output signal DOFF having a high signal level "H". In this case, the first AND circuit 11 outputs the output signal P having a low signal level "L", in response to the first signal D "H", the output of the inverter circuit 16 (the inverted signal "L" of the delay output signal DOFF), and the enable signal DEj "L". The second AND circuit 12 outputs the output signal N having a low signal level "L", in response to the second signal DB "H", the delay output signal DOFF "H", and the enable signal DEj "L". The first output circuit 13 inverts the output signal P "L" of the first AND circuit 11. Then, the first output circuit 13 outputs the inverted output signal P_B "H" to the first transistor MPT. The second output circuit 14 outputs the second output signal N "L" of the second AND circuit 12 to the second transistor MNT.

In other words, the logic circuit 8 stops outputting the first control signal P_B "L" to turn off the first transistor MPT.

In the second cycle T2 next to the first cycle T1, the data is supplied to the first and second data lines LB, LBB from the selected array portion 1-*j*. At this time, it is assumed that the potential of the second data line LBB is reduced to a level lower than the first potential.

The amplifier 6 of the selected bus drive circuit 2-*j* is supplied with the sense enable signal SE "H". When the potential of the second data line LBB is reduced to the second potential lower than the first potential, in response to the sense enable signal SE "H", the amplifier 6 of the selected bus drive circuit 2-*j* changes the signal level of the second signal DB from high level "H" to low level "L". In this case, the first signal D "H" is supplied to the first AND circuit 11 of the selected bus drive circuit 2-*j*. The second signal DB "L" is supplied to the second AND circuit 12 of the selected bus drive circuit 2-*j*.

At this time, the enable signal DEj having a high signal level "H" is supplied to the first AND circuit 11, second AND circuit 12, and latch circuit 15 of the selected bus drive circuit 2-*j*. In this case, the first AND circuit 11 outputs the output signal P having a low signal level "L", in response to the first signal D "H", the output of the inverter circuit 16 (the inverted signal "L" of the delay output signal DOFF), and the enable signal DEj "H". The second AND circuit 12 outputs the output signal N having a low signal level "L", in response to the second signal DB "L", the delay output signal DOFF "H", and the enable signal DEj "H". The first output circuit 13 inverts the output signal P "L" of the first AND circuit 11. Then, the first output circuit 13 outputs the inverted output signal P_B "H" to the first transistor MPT. The second output circuit 14 outputs the output signal N "L" of the second AND circuit 12 to the second transistor MNT.

In other words, because the logic circuit 8 stops outputting the first control signal P_B "L", the first transistor MPT remains turned off.

Next, the signal level of the sense enable signal SE is changed from high level "H" to low level "L". Then, the signal level of the enable signal DEj is changed from high level "H" to low level "L". As a result, the precharge signal PC "H" is supplied to the amplifier 6.

Next, case (B) will be described.

It is assumed that in the cycle prior to the third cycle T3, the bus output signal GBUS that is held by the bus holder 5 and output to the common bus 3 has a high signal level "H". In this case, the latch circuit 15 outputs the delay output signal DOFF having a high signal level "H".

Now, in the third cycle T3, the data is supplied to the first and second data lines LB, LBB from the selected array portion 1-*j*. At this time, it is assumed that the potential of the first data line LB is reduced to a level lower than the first potential.

The amplifier 6 of the selected bus drive circuit 2-*j* is supplied with the sense enable signal SE having a high signal level "H". When the potential of the first data line LB is reduced to the second potential lower than the second potential, in response to the sense enable signal SE "H", the amplifier 6 of the selected bus drive circuit 2-*j* changes the signal level of the first signal D from high level "H" to low level "L". In this case, the first signal D "L" is supplied to the first AND circuit 11 of the selected bus drive circuit 2-*j*. The second signal DB "H" is supplied to the second AND circuit 12 of the selected bus drive circuit 2-*j*.

At this time, the enable signal DEj having a high signal level "H" is supplied to the first AND circuit 11, second AND circuit 12, and latch circuit 15 of the selected bus drive circuit 2-*j*. In this case, the first AND circuit 11 outputs the output signal P "L", in response to the first signal D "L", the output of the inverter circuit 16 (the inverted signal "L" of the delay output signal DOFF), and the enable signal DEj "H". The second AND circuit 12 outputs the output signal N "H", in response to the second signal DB "H", the delay output signal DOFF "H", and the enable signal DEj "H". The first output circuit 13 inverts the output signal P "L". Then, the first output circuit 13 outputs the inverted signal P_B "H" to the first transistor MPT. The second output circuit 14 outputs the output signal N "H" of the second AND circuit 12 to the second transistor MNT as the second control signal N "H". As a result, the second transistor MNT is turned on in response to the second control signal N "H". Then, the signal level of the bus output signal GBUS is changed from high level "H" to low level "L".

Next, the signal level of the sense enable signal SE is changed from high level "H" to low level "L". Then, the signal level of the enable signal DEj is changed from high level "H"to low level "L". As a result, the precharge signal PC "H" is supplied to the amplifier 6. In response to the precharge signal PC "H", the amplifier 6 provides the first potential to the first and second data lines LB and LBB. At the same time, the amplifier 6 sets the signal level of the first and second signals D, DB to high level "H".

At this time, in response to the enable signal DEj "L", the latch circuit 15 of the selected bus drive circuit 2-j latches the bus output signal GBUS "L" that is held by the bus holder 5 and output to the common bus 3 in the previous cycle. Then, the latch circuit 15 outputs the latched bus output signal GBUS "L" as the delay output signal DOFF. In other words, the latch circuit 15 outputs the delay output signal DOFF having a low signal level "L". In this case, the first AND circuit 11 outputs the output signal P having a low signal level "L", in response to the first signal D "H", the output of the inverter circuit 16 (the inverted signal "H" of the delay output signal DOFF), and the enable signal DEj "L". The second AND circuit 12 outputs the output signal N having a low signal level "L", in response to the second signal DB "H", the delay output signal DOFF "L", and the enable signal DEj "L". The first output circuit 13 inverts the output signal P "L" of the first AND circuit 11. Then, the first output circuit 13 outputs the inverted signal P_B "H" to the first transistor MPT. The second output circuit 14 outputs the output signal N "L" of the second AND circuit 12 to the second transistor MNT.

In other words, the logic circuit 8 stops outputting the second control signal N "H" to turn off the second transistor MNT.

In the fourth cycle T4 next to the third cycle T3, the first and second data lines LB, LBB are supplied with the data from the selected array portion 1-j. At this time, it is assumed that the potential of the first data line LB is reduced to a level lower than the first potential.

The amplifier 6 of the selected bus drive circuit 2-j is supplied with the sense enable signal SE having a high signal level "H". When the potential of the first data line LB is reduced to the second potential lower than the first potential, in response to the sense enable signal SE "H", the amplifier 6 of the selected bus drive circuit 2-j changes the signal level of the first signal D from high level "H" to low level "L". In this case, the first signal D "L" is supplied to the first AND circuit 11 of the selected bus drive circuit 2-j. Further, the second signal DB "H" is supplied to the second AND circuit 12 of the selected bus drive circuit 2-j.

At this time, the enable signal DEj having a high signal level "H" is supplied to the first AND circuit 11, second AND circuit 12, and latch circuit 15 of the selected bus drive circuit 2-j. In this case, the first AND circuit 11 outputs the output signal P having a low signal level "L", in response to the first signal D "L", the output of the inverter circuit 16 (the inverted signal "H" of the delay output signal DOFF), and the enable signal DEj "H". The second AND circuit 12 outputs the output signal N having a low signal level "L", in response to the second signal DB "H", the delay output signal DOFF "L", and the enable signal DEj "H". The first output circuit 13 inverts the output signal P "L" of the first AND circuit 11. Then, the first output circuit 13 outputs the inverted output signal P_B "H" to the first transistor MPT. The second output circuit 14 outputs the output signal N "L" of the second AND circuit 12 to the second transistor MNT.

In other words, because the logic circuit 8 stops outputting the second control signal N "H", the second transistor MNT remains turned off.

Next, the signal level of the sense enable signal SE is changed from high level "H" to low level "L". Then, the signal level of the enable signal DEj is changed from high level "H"to low level "L". As a result, the precharge signal PC "H" is supplied to the amplifier 6.

As described above, in the semiconductor integrated circuit according to the first embodiment of the present invention, with respect to the transition from (I) to (II) in case (A), the logic circuit 8 stops outputting the first control signal P_B "L" to turn off the first transistor MPT. The reason why the logic circuit 8 stops outputting the first control signal P_B "L" to turn off the first transistor MPT is as follows. When the bus output signal GBUS, which is held by the bus holder 5 and output to the common bus 3 in the first cycle T1, has a high signal level "H", and when the first and second signals D, DB respectively have a high signal level "H"and a low signal level "L" in the second cycle T2, the bus output signal GBUS having the same level is output again.

Further, in the semiconductor integrated circuit according to the first embodiment of the present invention, with respect to the transition from (III) to (IV) in case (B), the logic circuit 8 of the selected bus drive circuit 2-j stops outputting the second control signal N "H" to turn off the second transistor MNT. The reason why the logic circuit 8 stops outputting the second control signal N "H" to turn off the second transistor MNT is as follows. When the bus output signal GBUS, which is held by the bus holder 5 and output to the common bus 3 in the third cycle T3, has a low signal level "L", and when first and second signals D, DB respectively have a low signal level "L" and a high signal level "H" in the fourth cycle T4 next to the third cycle T3, the bus output signal GBUS having the same signal level is output again.

In the conventional semiconductor integrated circuit, the bus output signal GBUS to be output from the buffer 7 of the selected bus drive circuit 102-j has the same signal level as the signal level of the bus output signal GBUS that is held by the bus holder 5 and output to the common bus 3 in the previous cycle. However, in case (II), the first AND circuit 111 of the logic circuit 108 of the selected bus drive circuit 102-j continues to output the output signal P "H" (indicated by the dotted line in FIG. 5). Also in case (IV), the second AND circuit 112 of the logic circuit 108 continues to output the output signal N "H" (indicated by the dotted line in FIG. 5). As a result, the logic circuit 108 of the selected bus drive circuit 102-j outputs the first signal P_B "L" to turn on the transistor MPT in case (II), and also outputs the second control signal N "H" to turn on the second transistor MNT in case (IV).

The semiconductor integrated circuit according to the first embodiment of the present invention is different in the operation of the logic circuit 8 of the elected bus drive circuit 2-j, when the bus output signal GBUS to be output from the buffer 7 of the selected bus circuit 2-j has the same signal level as the signal level of the bus output signal GBUS that is held by the bus holder 5 and output to the common bus 3 in the previous cycle. More specifically, in case (II), the first AND circuit 11 of the logic circuit 8 of the selected bus drive circuit 2-j continues to output the output signal P "L". In case (IV), the second AND circuit 12 continues to output the output signal N "L". Thus, the logic circuit 8 of the selected bus drive circuit 2-j can stop outputting the first control signal P_B "L" to turn off the first transistor MPT in case (II), and can stop outputting the second control signal N "L" to turn off the second transistor MNT in case (IV). If the operation in (II) and (IV) of the above cases (I) to (IV) occurs with a probability of 50%, it is possible to eliminate the unnecessary ON operation of the bus drive transistors (the first and second transistors MPT, MNT) with the same probability. In other words, the unnecessary current consumption can be reduced in the case of (II) and (IV). In addition, it is possible to reduce the peak current associated with the ON operation of the bus drive transistors, and to reduce the amount of noise associated with the peak current.

Further, in the semiconductor integrated circuit according to the first embodiment of the present invention, there is only a change from the conventional logic circuit 108 to the logic circuit 8 with no adjustment of the performance of the output buffer 7. Thus, this change can be achieved without impairing high speed data transfer to the common bus 3. The logic circuit 8 is formed by adding the latch circuit 15, the inverter circuit 16, or other devices to the logic circuit 108. However, these additional devices can be realized by a very small transistor, causing a very small increase in the current consumption and in the area.

Second Embodiment

In the first embodiment, the latch circuits 15 are provided in the bus drive circuits 2-1 to 2-n, respectively, to which the enable signals DE1 to DE-n are supplied. In a second embodiment, however, delay circuits are provided in the bus drive circuits 2-1 to 2-n, respectively, in which there is no need to supply the enable signals DE1 to DE-n. In the second embodiment, the same description as the first embodiment will be omitted.

Figure 6:
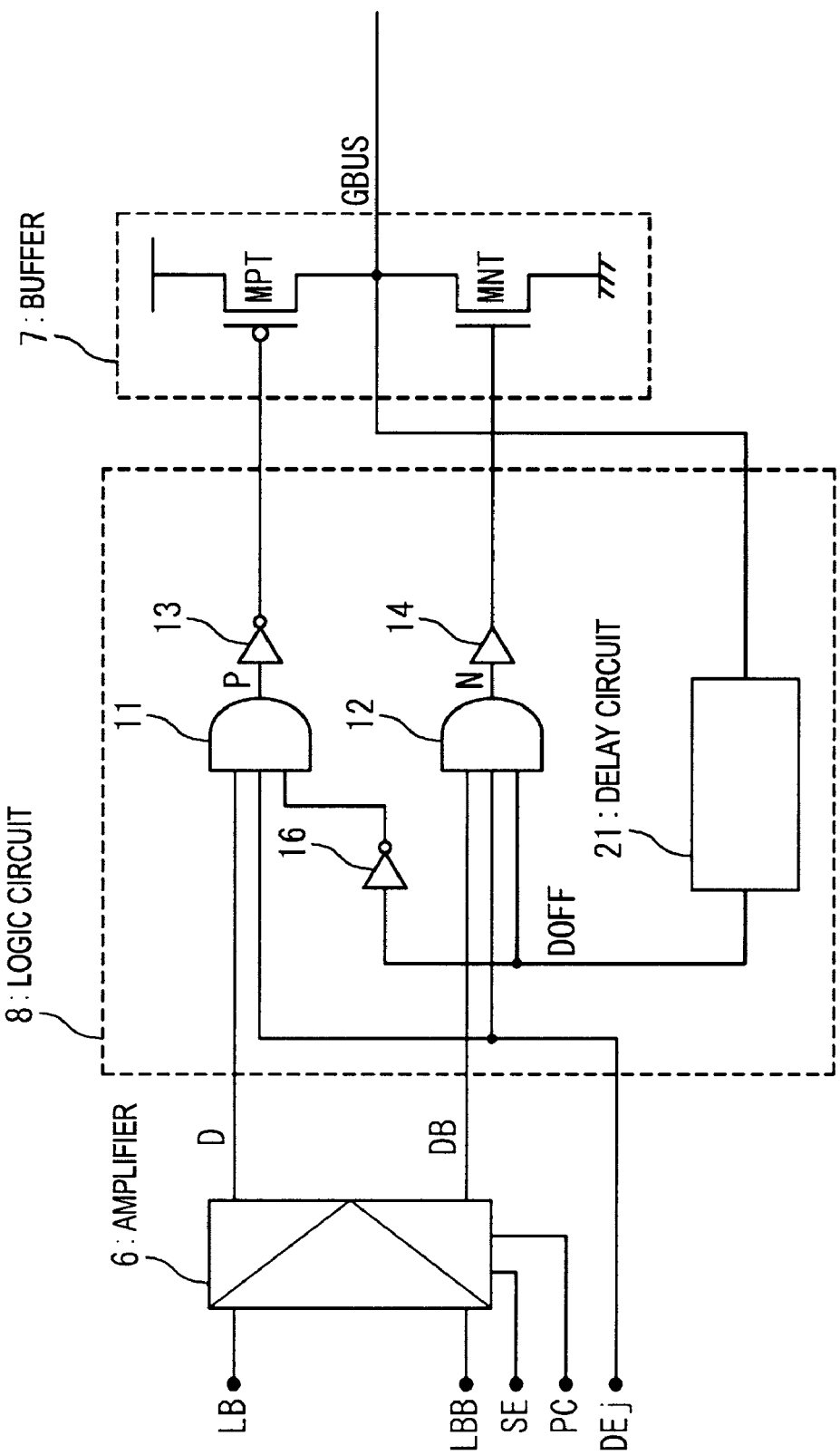
FIG. 6 is a block diagram of the bus drive circuits 2-1 to 2-n in a semiconductor integrated circuit according to a second embodiment of the present invention.

FIG. 6 is a block diagram of the bus drive circuits 2-1 to 2-n in the semiconductor integrated circuit according to the second embodiment of the present invention. The logic circuit 8 includes a delay circuit 21 replacing the latch circuit 15 of the first embodiment.

The input of the delay circuit 21 is coupled to the common bus 3. When a set time has passed after the signal level of the bus output signal GBUS is changed, the delay circuit 21 reads the bus output signal GBUS that is held by the bus holder 5 and output to the common bus 3 in the previous cycle. Then, the delay circuit 21 outputs the obtained bus output signal GBUS as the delay output signal DOFF.

If the delay time is too short, the output of the buffer 7 is turned off during the change in the signal level of the bus output signal GBUS. The potential of the common bus 3 stops halfway through (and remains in the intermediate state for a long time before being slowly changed to the logical level by the bus holder 5). This can cause a malfunction.

On the other hand, if the delay time is too long, the delay circuit 21 may not read the bus output signal GBUS, which is held by the bus holder 5 and output to the common bus 3, before the transition to the next cycle. In this case also, a malfunction can occur.

Thus, it is necessary to set the delay time not too long but not too short. For example, the set time represents the period from the change in the signal level of the bus output signal GBUS until the signal level of the enable signal DEj "H" is changed from high level "H" to low level "L". Or the set time represents the period from the change in the signal level of the bus output signal GBUS until the precharge signal PC "H" is supplied to the amplifier 6.

In the semiconductor integrated circuit according to the second embodiment of the present invention, the delay circuit 21 is provided in the logic circuit 8 of each of the bus drive circuits 2-1 to 2-n, instead of providing the latch circuit 15 as in the first embodiment. The delay circuits 21 of the bus drive circuits 2-1 to 2-n can operate without the enable signals DE1 to DE-n, respectively. Thus, compared to the first embodiment, the semiconductor integrated circuit according to the second embodiment of the present invention has the effect of reducing the load by n lines to increase the performance speed.

Further, in the semiconductor integrated circuit according to the second embodiment of the present invention, the delay circuit 21 can be configured in various methods. For example, a poly-silicon layer is used as a resistive element. In this case, it is possible to reduce the area by forming the resistive element over signal voltage wiring. However, the resistive element is different depending on the used production device technology. For example, the area may increase if the resistance is formed in a diffused layer within a silicon substrate. Thus, the optimization conditions are different depending on the production and design environments.

Third Embodiment

In the first embodiment, the logic circuit 8 is supplied with the enable signal DEj. However, as a third embodiment, it is also possible to configure that the logic circuit 8 operates without the enable signal DEj. In the third embodiment, the same description as the first embodiment will be omitted.

Figure 7:
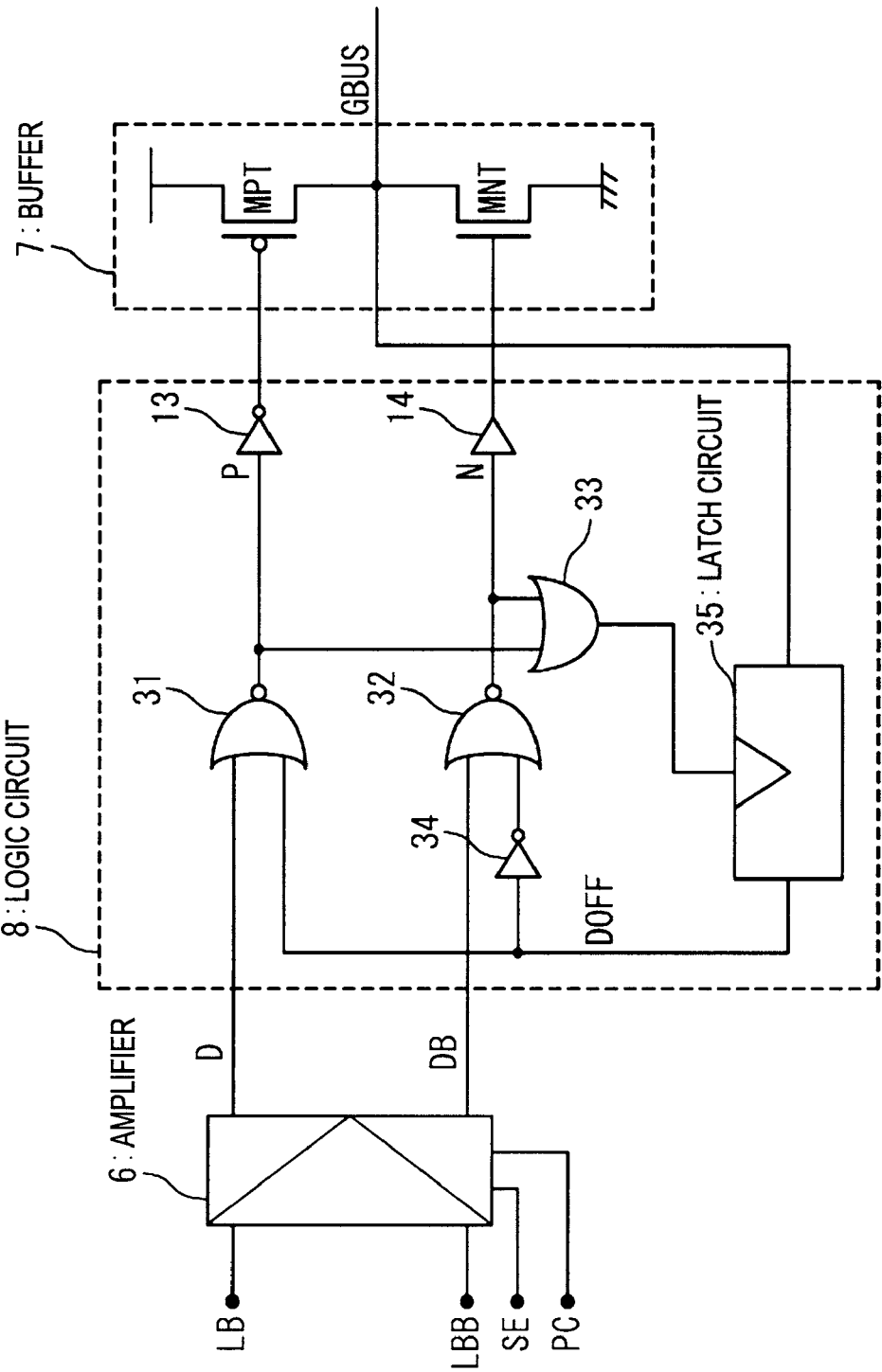
FIG. 7 is a block diagram of the bus drive circuits 2-1 to 2-n in a semiconductor integrated circuit according to a third embodiment of the present invention.

FIG. 7 is a block diagram of the bus drive circuit 2-1 to 2-n in the semiconductor integrated circuit according to the third embodiment of the present invention. The logic circuit 8 includes a first NOR circuit 31, a second NOR circuit 32, an OR circuit 33, an inverter circuit 34, and a latch circuit 35, instead of providing the first AND circuit 11, the second AND circuit 12, the latch circuit 15, and the inverter circuit 16 as in the first embodiment.

The first NOR circuit 31 is supplied with the first signal D and the delay output signal DOFF.

The second NOR circuit 32 is supplied with the second signal DB as well as the output of the inverter circuit 34.

The first output circuit 13 is an inverter circuit for inverting the output signal P of the first NOR circuit 31. The input of the first output circuit 13 is coupled to the output of the first NOR circuit 31. When the signal level of the output signal P of the first NOR circuit 31 is high level "H", the signal level of the output signal P_B of the first output circuit 13 is low level "L". At this time, the first output circuit 13 outputs the output signal P_B "L" as the first control signal P_B "L". In response to the first control signal P_B "L", the first transistor MPT is turned on and the signal level of the bus output signal GBUS is set to high level "H".

The second output circuit 14 is a buffer circuit. The input of the second output circuit 14 is coupled to the output of the second NOR circuit 32. When the signal level of the output signal N of the second NOR circuit 32 is high level "H", the signal level of the output signal N of the second output circuit 14 is high level "H". At this time, the second output circuit 14 outputs the output signal N "H" as the second control signal N "H". In response to the second control signal N "H", the second transistor MNT is turned on and the signal level of the bus output signal GBUS is set to low level "L".

The OR circuit 33 is supplied with the output signal P of the first NOR circuit 31, as well as the output signal N of the second NOR circuit 32.

When the signal level of the output signal of the OR circuit 33 is high level "H", the latch circuit 35 latches the bus output signal GBUS that is held by the bus holder 5 and output to the common bus 3 in the previous cycle. Then, the latch circuit 35 outputs the latched bus output signal GBUS as the delay output signal DOFF.

The inverter circuit 34 is coupled to the latch circuit 35 and the second NOR circuit 32. The inverter circuit 34 outputs the inverted signal of the delay output signal DOFF to the second NOR circuit 32.

In the semiconductor integrated circuit according to the third embodiment of the present invention, the first NOR circuit 31, the second NOR circuit 32, the OR circuit 33, the inverter circuit 34, and the latch circuit 35 are provided in the logic circuit 8 of each of the bus drive circuits 2-1 to 2-n, instead of providing the first AND circuit 11, the second AND circuit 12, the latch circuit 15, and the inverter circuit 16 as in the first embodiment. The bus drive circuits 2-1 to 2-n can operate without the enable signals DE1 to DE-n, respectively. Thus, compared to the first embodiment, the semiconductor integrated circuit according to the third embodiment of the present invention has the effect of reducing the load by (3×n) lines to increase the performance speed.

It is to be noted that in the semiconductor integrated circuit according to the third embodiment of the present invention, the logic circuit 8 is not limited to the configuration described above, and may have other configurations as long as they can achieve the same logical operation. For example, the logic circuit 8 can also generate the signal supplied to the latch circuit 35 based on the first and second signals D, DB.

The present invention has been described on the assumption, as a typical example, that the array portions 1-1 to 1-n are memory circuits. However, the present invention is not limited to the above example, and other configurations can also be applied as long as one bus drive circuit (the selected bus drive circuit 2-j) of the bus drive circuits 2-1 to 2-n supplies the output data (the bus output signal GBUS) to the common bus 3.

What is claimed is:

1. A semiconductor integrated circuit comprising:
a plurality of bus drive circuits for receiving data input;
a common bus coupled to the bus drive circuits; and
a bus holder coupled to the common bus,
wherein one of the bus drive circuits is selected as the selected bus drive circuit,
wherein when a logical value corresponding to the data input to be output is the same as a logical value that is held by the bus holder and output to the common bus, the selected bus drive circuit stops outputting the logical value corresponding to the data input to the common bus.

2. The semiconductor integrated circuit according to claim 1,
wherein each of the bus drive circuits includes:
a buffer including a first transistor and a second transistor;
an amplifier for setting a signal level of first and second signals to a high level in response to a precharge signal supplied in each cycle; and
a logic circuit,
wherein in response to a first control signal, the first transistor of the buffer is turned on to set signal level of a bus output signal, which is the logical value corresponding to the data input, to a high level,
wherein in response to a second control signal, the second transistor of the buffer is turned on to set the signal level of the bus output signal to a low level;
wherein in response to a sense enable signal supplied to the amplifier whose bus drive circuit is the selected bus drive circuit, the particular amplifier changes the signal level of the first or second signals from the high level to a low level,
wherein the logic circuit outputs the first control signal when the signal levels of the first and second signals are the high level and low level, respectively,
wherein the logic circuit outputs the second control signal when the signal levels of the first and second signals are the low level and high level, respectively, and
wherein when the bus output signal is output from the buffer based on the signal level of the first or second signal, the logic circuit stops outputting the first or second control signal, when the signal level of the bus output signal to be output from the buffer is the same as the signal level of the bus output signal that is held by the bus holder and output to the common bus in a previous cycle.

3. The semiconductor integrated circuit according to claim 2,
wherein the logic circuit stops outputting the first control signal when the bus output signal that is held by the bus holder and output to the common bus in the previous cycle has a high signal level and when the first and second signals respectively have a high signal level and a low signal level, and
wherein the logic circuit stops outputting the second control signal when the bus output signal that is held by the bus holder and output to the common bus in the previous cycle has a low signal level and when the first and second signals respectively have a low signal level and a high signal level.

4. The semiconductor integrated circuit according to claim 2,
wherein the logic circuit includes:
a first AND circuit supplied with the first signal as well as an inverted signal of a delay output signal;
a second AND circuit supplied with the second signal and the delay output signal;
a first output circuit for outputting the first control signal to turn on the first transistor when the signal level of the output signal of the first AND circuit is the high level;
a second output circuit for outputting the second control signal to turn on the second transistor when the signal level of the output signal of the second AND circuit is the high level; and
a latch circuit coupled at the input thereof to the common bus,
wherein when the bus drive circuit of the first AND circuit is the selected bus drive circuit, the particular first AND circuit is supplied with an enable signal having a high signal level, during the period from the time when the signal level of the first or second signal is changed from the high level to the low level to the time when the precharge signal is supplied to the amplifier,
wherein when the bus drive circuit of the second AND circuit is the selected bus drive circuit, the particular second AND circuit is supplied with the enable signal, and
wherein in response to a latch enable signal supplied to the latch circuit whose bus drive circuit is the selected bus drive circuit, the particular latch circuit latches the bus output signal that is held by the bus holder and output to the common bus in the previous cycle, and outputs the bus control signal as the delay output signal.

5. The semiconductor integrated circuit according to claim 4,
wherein the latch enable signal is generated by changing the signal level of the enable signal from the high level to the low level.

6. The semiconductor integrated circuit according to claim 2, further comprising:
a first AND circuit supplied with the first signal as well as an inverted signal of a delay output signal;
a second AND circuit supplied with the second signal and the delay output signal;
a first output circuit for outputting the first control signal to turn on the first transistor when the signal level of the output signal of the first AND circuit is the high level;
a second output circuit for outputting the second control signal to turn on the second transistor when the signal level of the output signal of the second AND circuit is the high level; and
a delay circuit coupled at the input thereof to the common bus,
wherein when the bus drive circuit of the first AND circuit is the selected bus drive circuit, the particular first AND circuit is supplied with an enable signal having a high signal level, during the period from the time when the signal level of the first or second signal is changed from the high level to the low level to the time when the precharge signal is supplied to the amplifier;
wherein when the bus drive circuit of the second AND circuit is the selected bus drive circuit, the particular second AND circuit is supplied with the enable signal, and
wherein when a set time has passed after the signal level of the bus output signal is changed, the delay circuit reads the bus output signal that is held by the bus holder and output to the common bus in the previous cycle, and outputs the obtained bus output signal as the delay output signal.

7. The semiconductor integrated circuit according to claim 6,
wherein the set time represents a period from the time when the signal level of the bus output signal is changed to the time when the signal level of the enable signal is changed from the high level to the low level.

8. The semiconductor integrated circuit according to claim 6,
wherein the set time represents a period from the time when the signal level of the bus output signal is changed to the time when the precharge signal is supplied to the amplifier.

9. The semiconductor integrated circuit according to claim 2,
wherein the logic circuit includes:
a first NOR circuit supplied with the first signal and a delay output signal;
a second NOR circuit supplied with the second signal as well as an inverted signal of the delay output signal;
a first output circuit for outputting the first control signal to turn on the first transistor when a signal level of an output signal of the first NOR circuit is a high level;
a second output circuit for outputting the second control signal to turn on the second transistor when a signal level of an output signal of the second NOR circuit is a high level;
an OR circuit supplied with the output signal of the first NOR circuit as well as the output signal of the second NOR circuit; and
a latch circuit for latching the bus output signal that is held by the bus holder and output to the common bus in the previous cycle when the signal level of the output signal of the OR circuit is the high level, and outputting the latched bus output signal as the delay output signal.

10. The semiconductor integrated circuit according to claim 4,
wherein the first transistor is a P-type transistor coupled between a power source and the common bus, including a gate coupled to the output of the first output circuit,
wherein the second transistor is an N-type transistor coupled between the common bus and ground, including a gate coupled to the output of the second output circuit,
wherein the first output circuit is an inverter circuit to invert the output signal of the first AND circuit,
wherein the first output circuit outputs the inverted output signal to the first transistor as the first control signal when the signal level of the inverted the output signal is the low level, and
wherein the second output circuit is a buffer circuit to output the output signal of the second AND circuit to the second transistor as the second control signal when the signal level of the output signal of the second AND circuit is the high level.

11. The semiconductor integrated circuit according to claim 1, further comprising a circuit coupled to the common bus to receive the bus output signal as output data.

12. The semiconductor integrated circuit according to claim 1, further comprising:
a plurality of array portions; and
first and second data lines coupled to each of the array portions,
wherein the first and second data lines are supplied with data from a selected array portion which is one of the array portions,
wherein each of the bus drive circuits is coupled to the first and second data lines of each of the array portions,
wherein a selected bus drive circuit of the bus drive circuits is the bus drive circuit coupled to the first and second data lines of the selected array portion,
wherein the common bus is supplied with a bus output signal representing the data, from the selected bus drive circuit,
wherein in response to the precharge signal supplied in each cycle, the amplifier supplies a first potential to the first and second data lines, and sets the signal level of the first and second signals corresponding to the first and second data lines, to the high level,
wherein when a potential of the first or second data line is reduced to a second potential lower than the first potential, the amplifier changes the signal level of the first or second signal from the high level to the low level in response to the sense enable signal.

13. The semiconductor integrated circuit according to claim 12,
wherein each of the allay portions includes:
a memory cell array including memory cells arranged in a matrix form to hold the data;
word lines provided in rows of the memory cell array; and
first and second bit lines arranged in columns of the memory cell array, and coupled to the first and second data lines, respectively, wherein a selected word line corresponding to a specified line address is selected from the word lines of the selected array portion, wherein selected first and second bit lines corresponding to a specified row address are selected from the first and second lines of the selected array portion, wherein the data is read from the memory cell coupled to the selected word line and to the selected first and second bit lines, of the memory cells of the selected array portion, and wherein when a potential difference is generated between the selected first and second bit lines, the data is supplied to the first and second data lines.

14. The bus drive circuit used in the semiconductor integrated circuit according to claim 1.

15. The logic circuit used in the semiconductor integrated circuit according to claim 2.

* * * * *